(12) United States Patent
Guo et al.

(10) Patent No.: US 11,805,665 B2
(45) Date of Patent: Oct. 31, 2023

(54) DISPLAY PANEL, MANUFACTURING METHOD THEREOF, AND MASK PLATE GROUP

(71) Applicant: WUHAN CHINA STAR OPTOELECTRONICS SEMICONDUCTOR DISPLAY TECHNOLOGY CO., LTD., Wuhan (CN)

(72) Inventors: Shuo Guo, Wuhan (CN); Jing Wang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 314 days.

(21) Appl. No.: 17/267,484

(22) PCT Filed: Jul. 9, 2020

(86) PCT No.: PCT/CN2020/100986
§ 371 (c)(1),
(2) Date: Feb. 9, 2021

(87) PCT Pub. No.: WO2021/227227
PCT Pub. Date: Nov. 18, 2021

(65) Prior Publication Data
US 2022/0190280 A1 Jun. 16, 2022

(30) Foreign Application Priority Data
May 11, 2020 (CN) .......................... 202010393167.4

(51) Int. Cl.
*H01L 51/50* (2006.01)
*H10K 50/816* (2023.01)
(Continued)

(52) U.S. Cl.
CPC ......... *H10K 50/816* (2023.02); *H10K 50/818* (2023.02); *H10K 71/00* (2023.02);
(Continued)

(58) Field of Classification Search
CPC ............... H10K 50/816; H10K 50/822; H10K 2102/351
See application file for complete search history.

(56) References Cited

FOREIGN PATENT DOCUMENTS

| CN | 104157550 A | 11/2014 |
|---|---|---|
| CN | 106058079 A | 10/2016 |

(Continued)

OTHER PUBLICATIONS

International Search Report in International application No. PCT/CN2020/100986, dated Jan. 27, 2021.
(Continued)

*Primary Examiner* — Anthony Ho
(74) *Attorney, Agent, or Firm* — PV IP PC; Wei Te Chung; Zhigang Ma

(57) ABSTRACT

A display panel, a manufacturing method thereof, and a mask plate group are provided. The display panel, from bottom to top, includes a light-sensing device, a substrate, and an anode layer. The anode layer in a display area includes a first light-transmitting layer and a reflective layer, which are stacked. The anode layer in a light-sensing area includes a second light-transmitting layer, and the light-sensing device is disposed in the light-sensing area.

13 Claims, 6 Drawing Sheets

(51) Int. Cl.
  H10K 50/818 (2023.01)
  H10K 71/00 (2023.01)
  H10K 77/10 (2023.01)
  H10K 50/822 (2023.01)
  H10K 59/12 (2023.01)
  H10K 102/00 (2023.01)
(52) U.S. Cl.
  CPC ........... H10K 77/10 (2023.02); H10K 50/822 (2023.02); H10K 59/12 (2023.02); H10K 59/1201 (2023.02); H10K 2102/351 (2023.02)

(56) References Cited

FOREIGN PATENT DOCUMENTS

| | | | |
|---|---|---|---|
| CN | 107946341 A | 4/2018 |
| CN | 108666437 A | 10/2018 |
| CN | 109306450 A | 2/2019 |
| CN | 109371361 A | 2/2019 |
| CN | 109957754 A | 7/2019 |
| CN | 110047380 A | 7/2019 |
| CN | 110085766 A | 8/2019 |
| CN | 110211972 A | 9/2019 |
| CN | 110265461 A | 9/2019 |
| CN | 110416272 A | 11/2019 |
| CN | 110473988 A | 11/2019 |
| CN | 110534550 A | 12/2019 |
| CN | 110649081 A | 1/2020 |
| CN | 110729335 A | 1/2020 |
| CN | 110767846 A | 2/2020 |
| CN | 210073852 U | 2/2020 |
| CN | 110923625 A | 3/2020 |
| JP | 2015118761 A | 6/2015 |
| TW | I282584 B | 6/2007 |

OTHER PUBLICATIONS

Written Opinion of the International Search Authority in International application No. PCT/CN2020/100986, dated Jan. 27, 2021.
Chinese Office Action issued in corresponding Chinese Patent Application No. 202010393167.4 dated May 31, 2022, pp. 1-10.

DISPLAY PANEL, MANUFACTURING METHOD THEREOF, AND MASK PLATE GROUP

RELATED APPLICATIONS

This application is a Notional Phase of PCT Patent Application No. PCT/CN2020/100986 having international filing date of Jul. 9, 2020, which claims the benefit of priority of Chinese Patent Application Nos. 202010393167.4 filed on May 11, 2020. The contents of the above applications are all incorporated by reference as if fully set forth herein in their entirety.

FIELD

The present disclosure relates to the field of display technologies, and more particularly, relates to a display panel, a manufacturing method thereof, and a mask plate group.

BACKGROUND

Organic light-emitting diode (OLED) display screens are suitably applied to full-screen panels due to their flexibility and bendability, and an under-screen camera technology of the OLED display panels is vital.

However, light transmittance of conventional layers, such as an anode layer, a luminescent layer, and a cathode layer, is relatively low, resulting in an inability of under-screen camera or other light-sensing devices to capture light. Therefore, corresponding functions of the under-screen camera and the light-sensing devices cannot be well realized.

As a result, it is necessary to provide a display panel, a manufacturing thereof, and a mask plate group to increase light reaching the under-screen camera or other light-sensing devices, thereby improving working performance of the under-screen camera or the light-sensing devices of the OLED display screens.

SUMMARY

The present disclosure provides a display panel, a manufacturing method thereof, and a mask plate group. In the display panel, an anode layer in a display area includes a first light-transmitting layer and a reflective layer, and the anode layer in a light-sensing area includes a second light-transmitting layer. Thus, a following problem is solved: due to great thickness of layers above an under-display camera or other light-sensing devices, light transmittance of OLED display screens is relatively low, leading to corresponding functions of the under-display camera or the light-sensing devices unable to be well realized.

SUMMARY

An embodiment of the present disclosure provides a display panel, including a display area and a light-sensing area, wherein the display panel includes:
a substrate;
an anode layer disposed on a side of the substrate, wherein the anode layer in the display area includes a first light-transmitting layer and a reflective layer, which are stacked, and the anode layer in the light-sensing area includes a second light-transmitting layer; and
a light-sensing device disposed on a side of the substrate away from the anode layer in the light-sensing area.

In one embodiment, the substrate includes:
a first substrate disposed in the light-sensing area; and
a second substrate disposed in the display area, wherein a thickness of the first substrate is less than a thickness of the second substrate.

In one embodiment, the display panel further includes:
a thin-film transistor (TFT) layer disposed on a side of the substrate near the anode layer, wherein the TFT layer includes a plurality of TFTs disposed in the display area.

In one embodiment, the display panel further includes:
a cathode layer disposed on a side of the anode layer away from the substrate in the display area.

In one embodiment, when the first light transmitting layer and the second light transmitting layer are disposed on a same layer, the anode layer further includes:
a third light-transmitting layer disposed on the second light-transmitting layer and on a side of the reflective layer away from the light-sensing device.

An embodiment of the present disclosure provides a mask plate group configured to manufacture the above display panel, wherein the display panel includes the display area and the light-sensing area, the mask plate group includes a first mask plate configured to process a photoresist layer in the display area and the light-sensing area, and the first mask plate includes:
a first opening part, wherein the first opening part corresponds to the light-sensing area and is configured to expose the photoresist layer in the light-sensing area; and
a first shielding part, wherein the first shielding part corresponds to the display area, the photoresist layer is disposed on a reflective film, the first shielding part is configured to shield the photoresist layer in the display area, thereby retaining the photoresist layer in the display area, and further retaining the reflective film in the display area to form the reflective layer.

In one embodiment, the mask plate group further includes a second mask plate, wherein the second mask plate includes:
a second shielding part, wherein the second shielding part corresponds to the light-sensing area and is configured to block an evaporation material from being deposited on the light-sensing area during an evaporation process; and
a second opening part, wherein the second opening part corresponds to the display area and is configured to allow the evaporation material to be deposited in the display area to form the cathode layer.

An embodiment of the present disclosure provides a method of manufacturing the above display panel, wherein the display panel includes the display area and the light-sensing area, and the method includes following steps:
providing the substrate;
forming the anode layer on the substrate, wherein the anode layer in the display area includes a first light-transmitting layer and a reflective layer, which are stacked, and the anode layer in the light-sensing area includes a second light-transmitting layer; and
disposing the light-sensing device on the side of the substrate away from the anode layer, wherein the light-sensing device corresponds to the light-sensing area.

In one embodiment, in the step of forming the anode layer on the substrate, wherein the anode layer in the display area includes a first light-transmitting layer and a reflective layer, which are stacked, and the anode layer in the light-sensing area includes a second light-transmitting layer, the method includes following steps:
forming the first light-transmitting layer and the second light-transmitting layer on the substrate, and sequentially forming a reflective film and a photoresist layer on the first light-transmitting layer and the second light-transmitting layer, wherein the first light-transmitting area is disposed in the display area, the second light-transmitting layer is disposed in the light-sensing area, and the reflective film and the photoresist layer are disposed in the display area and the light-sensing area;

performing an exposure process on the photoresist layer with a first mask plate, wherein the first mask plate includes a first opening part and a first shielding part, the first opening part corresponds to the light-sensing area and is configured to expose the photoresist layer in the light-shielding area, and the first shielding part corresponds to the display area and is configured to shield the photoresist layer in the display area;

removing the photoresist layer in the light-sensing area, and retaining the photoresist layer in the display area to form a photoresist pattern; and removing the reflective film not covered by the photoresist pattern, and retaining the reflective film covered by the photoresist pattern to form the reflective layer.

In one embodiment, after the step of removing the reflective film not covered by the photoresist pattern, and retaining the reflective film covered by the photoresist pattern to form the reflective layer, the method further includes a following step:

forming a third light-transmitting layer on the reflective layer and the second light-shielding layer.

In one embodiment, before the step of forming the light-sensing device on the side of the substrate away from the anode layer, the method includes:

processing the substrate to form a first substrate and a second substrate, wherein a thickness of the first substrate is less than a thickness of the second substrate, the first substrate corresponds to the light-sensing area, and the second substrate corresponds to the display area.

In one embodiment, before the step of forming the anode layer on the substrate, wherein the anode layer in the display area includes a first light-transmitting layer and a reflective layer, which are stacked, and the anode layer in the light-sensing area includes a second light-transmitting layer, the method includes:

forming a thin-film transistor (TFT) layer on the substrate, wherein the TFT layer includes a plurality of TFTs disposed in the display area.

In one embodiment, after the step of forming the anode layer on the substrate, wherein the anode layer in the display area includes a first light-transmitting layer and a reflective layer, which are stacked, and the anode layer in the light-sensing area includes a second light-transmitting layer, the method includes a following step:

forming a cathode layer on the anode layer in the display area.

In one embodiment, in the step of forming the cathode layer on the anode layer in the display area, the method includes a following step:

depositing an evaporation material on the anode layer with a second mask plate, wherein the second mask plate includes a second shielding part and a second opening part, the second shielding part corresponds to the light-shielding area and is configured to block the evaporation material from being deposited in the light-sensing area during an evaporation process, and the second opening part corresponds to the display area and is configured to allow the evaporation material to be deposited in the display area to form the cathode layer.

Regarding the beneficial effects: the present disclosure provides a display panel, a manufacturing method thereof, and a mask plate group. The display panel includes a display area and a light-sensing area, an anode layer in the display area includes a first light-transmitting layer and a reflective layer, which are stacked, the anode layer in the light-sensing area includes a second light-transmitting layer, and a light-sensing device is disposed on a side of a substrate away from the anode layer in the light-sensing area. In the present disclosure, only the second light-transmitting layer is disposed in the anode layer in the light-sensing device, and a reflective layer is omitted. Therefore, light transmittance of layers above the light-sensing device is increased, and working performance of the light-sensing device of the display panel is improved.

DESCRIPTION OF DRAWINGS

The present disclosure is illustrated below with reference to appended drawings. It should be noted that the appended drawings below are merely used to illustrate some embodiment of the present disclosure, from which those skilled in the art can derive further figures without making any inventive efforts.

DETAILED DESCRIPTION

Figure 1:
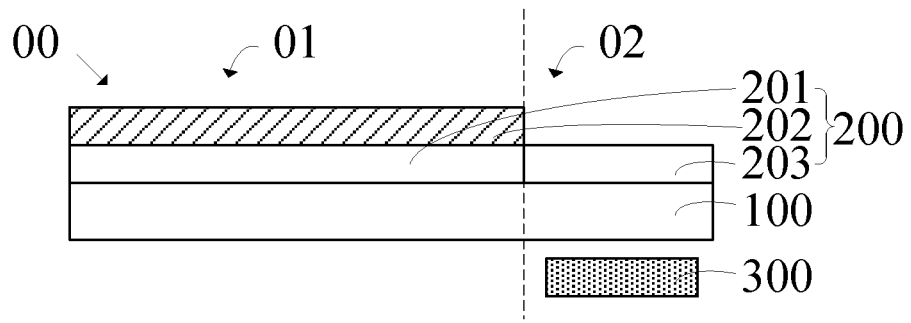
FIG. 1 is a sectional schematic view showing a first display panel provided by an embodiment of the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

In the description of the present disclosure, it should be understood that terms such as "on", "under", "away from", "near" as well as derivatives thereof should be construed to refer to the orientation as then described or as shown in the drawings under discussion. For example, an object "on" another object may include an embodiment in which the object is right "on" another object, an embodiment in which the object is "above" another object, or an embodiment in which the object is "on" an upper surface of another object. All embodiments in which the object has a sea level elevation greater than the sea level elevation of another object are permitted. These relative terms are for convenience of description, do not require that the present disclosure be constructed or operated in a particular orientation, and shall not be construed as causing limitations to the present disclosure.

In addition, it should be noted that appended drawings only show structures relating to the present disclosure, and some details not relevant to the present disclosure are omitted, thereby simplifying the appended drawings and spotlighting the spirit of the present disclosure. Actual devices are not completely the same as devices shown in the appended drawings, and are not limited to the appended drawings.

In the description of the present disclosure, it should be noted that unless there are express rules and limitations, the terms such as "connect," should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the drawings, the identical or similar reference numerals constantly denote the identical or similar elements. Specific features, structures, and characteristics, which are mentioned in the present disclosure may be included in at least one embodiment. Phrases in the present disclosure are not necessary to refer to the same embodiment and do not refer to an independent embodiment and an alternative embodiment which are exclusive to other embodiments. It should be explicitly and implicitly understood by those skilled in the art that embodiments described in the present disclosure may be combined with other embodiments.

The present disclosure provides a display panel, including but not limited to following embodiments.

In one embodiment, as shown in FIG. 1, a display panel 00 includes a display area 01 and a light-sensing area 02. The display panel 00 includes: a substrate 100; an anode layer 200 disposed on a side of the substrate 100, wherein the anode layer 200 in the display area 01 includes a first light-transmitting layer 201 and a reflective layer 202, which are stacked; the anode layer 200 in the light-sensing area 02 includes a second light-transmitting layer 203; and a light-sensing device 300 disposed on a side of the substrate 100 away from the anode layer 200 in the light-sensing area 02.

The light-sensing area 02 may be completely or partly surrounded by the display area 01. For example, the sensing area 02 may be defined on a top left corner, a top right corner, or middle portions of first few rows of the display panel 00. A Specific shape of the light-sensing area 02 may be determined according to a shape of a vertical projection of the light-sensing device 300. A size of the light-sensing area 02 is not less than a size of the light-sensing device 300, thereby ensuring that the light-sensing device 300 can work normally.

The light-sensing device 300 may work individually, or may be embedded in a camera lens or a fingerprint recognition device.

The anode layer 200 in the display area 01 includes the first light-transmitting layer 201 and the reflective layer 202, which are stacked. The anode layer 200 in the light-sensing area 02 includes the second light-shielding layer 203. Therefore, a thickness the anode layer 200 in the display area 01 is greater than a thickness of the anode layer 200 in the light-sensing area 02, and light transmittance the anode layer 200 in the light-sensing area 02 is higher than light transmittance of the anode layer 200 in the display area 01.

As shown in FIG. 1, the first light-transmitting layer 201 and the second light-transmitting layer 203 may be disposed on a same layer. Light transmittance of the second light-transmitting layer 203 should be ensured, thereby allowing ambient light to pass through the second light-transmitting layer 203 and enter the light-sensing device 300. Furthermore, a thickness of the first light-transmitting layer 201 and a thickness of the second light-transmitting layer 203 may be equal, and a material of the first light-transmitting layer 201 and a material of the second light-transmitting layer 203 may be same. For example, the first light-transmitting layer 201 and the second light-transmitting layer 203 may be simultaneously formed by depositing a material on the substrate 100, thereby improving manufacturing efficiency. Specifically, the first light-transmitting layer 201 and the second light-transmitting layer 203 may be formed by depositing a transparent conductive film on the entire substrate 100 or other layers. The transparent conductive film may be an indium tin oxide (ITO) thin film or an Al-doped zinc oxide thin film.

A material of the reflective layer 202 may be a conductive material having high reflectivity, thereby reflecting ambient light or light emitted from a luminescent device, and increasing luminous intensity of the display panel. For example, the material of the reflective layer 202 may be metal elements, and more specifically, may be silver.

Figure 2:
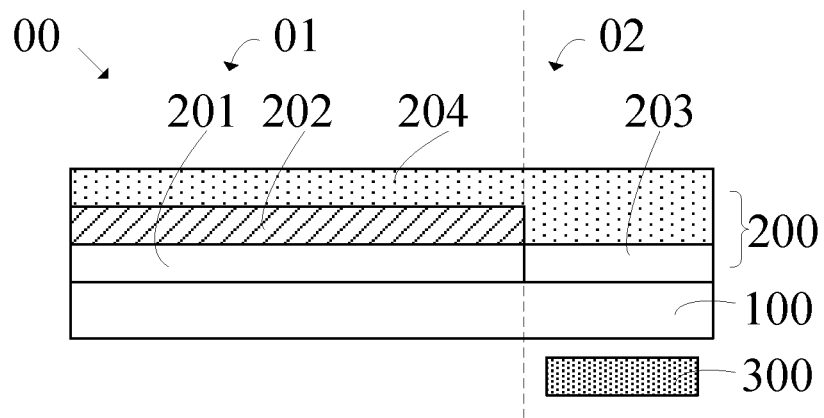
FIG. 2 is a sectional schematic view showing a second display panel provided by an embodiment of the present disclosure.

In one embodiment, as shown in FIG. 2, when the first light-transmitting layer 201 and the second light-transmitting layer 203 are disposed on the same layer, the anode layer 200 further includes: a third light-transmitting layer 204 disposed on a side of the second light-transmitting layer 203 and the reflective layer 202 away from the light-sensing device 300.

Light transmittance of the third light-transmitting layer 204 in the light-sensing area 02 should be ensured, thereby allowing ambient light to pass through the second light-transmitting layer 203 and the third light-transmitting layer 204 and enter the light-sensing device 300. Specifically, a surface of a side of the third light-transmitting layer 204 away from the substrate 100 is a flat surface. That is, a total thickness of the first light-transmitting layer 201, the reflective layer 202, and the third light-transmitting layer 204 in the display area 01 may be equal to a total thickness of the first light-transmitting layer 201, the reflective layer 202, and the third light-transmitting layer 204 in the light-sensing area 02. As a result, flatness of the anode layer 200 is improved, which is beneficial for forming other layers on the anode layer 200. Specifically, a material and a forming method of the third light-transmitting layer 204 may be same as those of the first light-transmitting layer 201.

Furthermore, a thickness of the light-transmitting layer 201 and a thickness of the light-transmitting layer 203 may be 50 nm, a thickness of the reflective layer 202 may be 10 nm, and a thickness of the third light-transmitting layer 204 on the reflective layer 202 may be 50 nm. In this case, average light transmittance of the anode layer 200 in the display area 01 reaches 83.17%. It should be understood that light transmittance of the anode layer in the light-sensing area 02 may be greater than 83.17% because the reflective layer 202 is not disposed in the light-sensing area 02.

Figure 3:
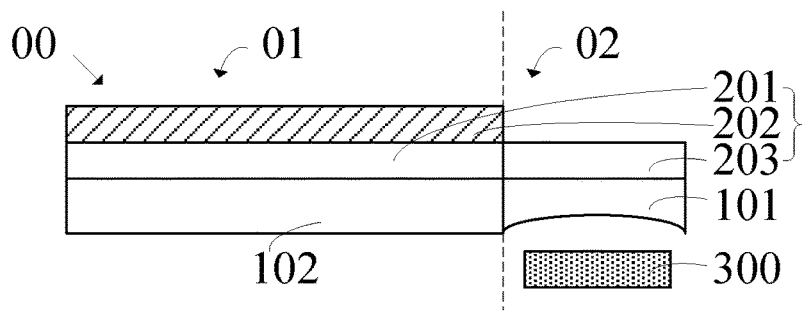
FIG. 3 is a sectional schematic view showing a third display panel provided by an embodiment of the present disclosure.

In some embodiment, as shown in FIG. 3, the substrate 100 includes: a first substrate 101 disposed in the light-sensing area 02; and a second substrate 102 disposed in the display area 01, wherein a thickness of the first substrate 101 is less than a thickness of the second substrate 102.

The first substrate 101 may have an even thickness. Alternatively, a surface of a side of the first substrate 101 near the light-sensing device 300 may be a curved surface. The thickness of the first substrate 101 may be determined according to a height of the light-sensing device 300, and a shape of the surface of the side of the first substrate 101 near the light-sensing device 300 may be determined according to a shape of the light-sensing device 300.

Figure 4:
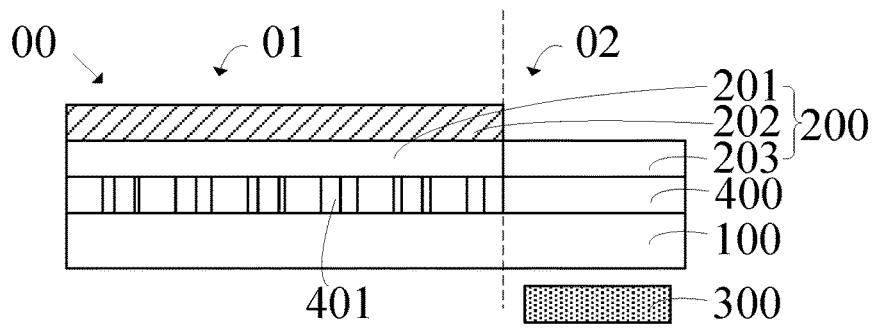
FIG. 4 is a sectional schematic view showing a fourth display panel provided by an embodiment of the present disclosure.

In one embodiment, as shown in FIG. 4, the display panel 00 further includes: a thin-film transistor (TFT) layer 400 disposed on a side of the anode layer 200 near the substrate 100. The TFT layer 400 includes a plurality of TFTs 401 in the display area 01.

Specifically, the TFTs 401 are electrically connected to corresponding areas on the anode layer 200, thereby controlling luminance of the corresponding areas on the anode layer 200. It should be understood that the TFTs 401 include devices having low light transmittance, and the TFTs 401 at a same row or at a same column are connected to each other by a same gate line or a same data line, thereby transmitting signals. In addition, the TFTs 401 are not disposed in the light-sensing area 02. Specifically, the TFT layer 400 in the light-sensing area 02 are not provided with the TFTs 401 having extremely low light transmittance, and are not provided with the gate line and the data line. In the present disclosure, because the TFTs 401 are not disposed on the TFT layer 400 in the light-sensing area 02, a number of metal lines, such as the gate line and the data line, in the light-sensing area 02 may be further reduced, and light transmittance of the light-sensing area 02 may be increased.

Figure 5:
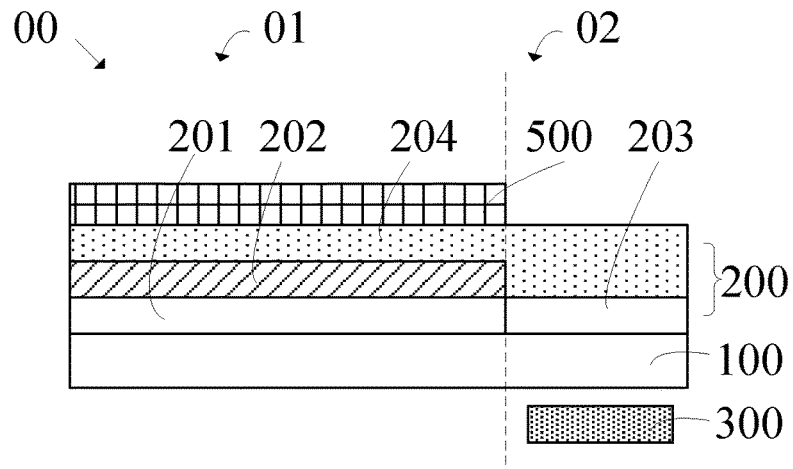
FIG. 5 is a sectional schematic view showing a fifth display panel provided by an embodiment of the present disclosure.

In one embodiment, as shown in FIG. 5, the display panel 00 further includes: a cathode layer 500 disposed on a side of the anode layer 200 away from the substrate 100 in the display area 01.

It should be noted that because the TFTs 401 and the reflective layer 202 are disposed only in the display area 01, the cathode layer 500 may be disposed only in the display area 01. Therefore, not only can the display area 01 display images normally, but also light transmittance of layers above the light-sensing device 300 of the display panel 00 can be further increased.

A material of the cathode layer 500 may be a magnesium silver alloy or a lithium aluminum alloy. Specifically, the cathode layer 500 can be formed by evaporating low work function metal with lively chemical property and high work function work metal with stable chemical property, thereby improving quantum efficiency and stability of the device. Alternatively, the cathode layer 500 may be two electrodes formed from a single metal layer made of a metal element and a barrier layer, which is disposed between the single metal layer and a corresponding luminescent device, made of lithium fluoride, cesium fluoride, or rubidium fluoride, between the signal metal layer and corresponding luminescent devices. Therefore, luminous efficiency and a current-voltage characteristic curve may be improved. Alternatively, the cathode layer 500 may include the single metal layer and an organic layer, which is doped with low work function metal, between the single metal layer and the corresponding luminescent devices, thereby significantly improving performance of the luminescent device.

The present disclosure further provides a mask plate group configured to manufacture the above display panels. The mask plate group includes, but is not limited to, following embodiments.

Figure 6:
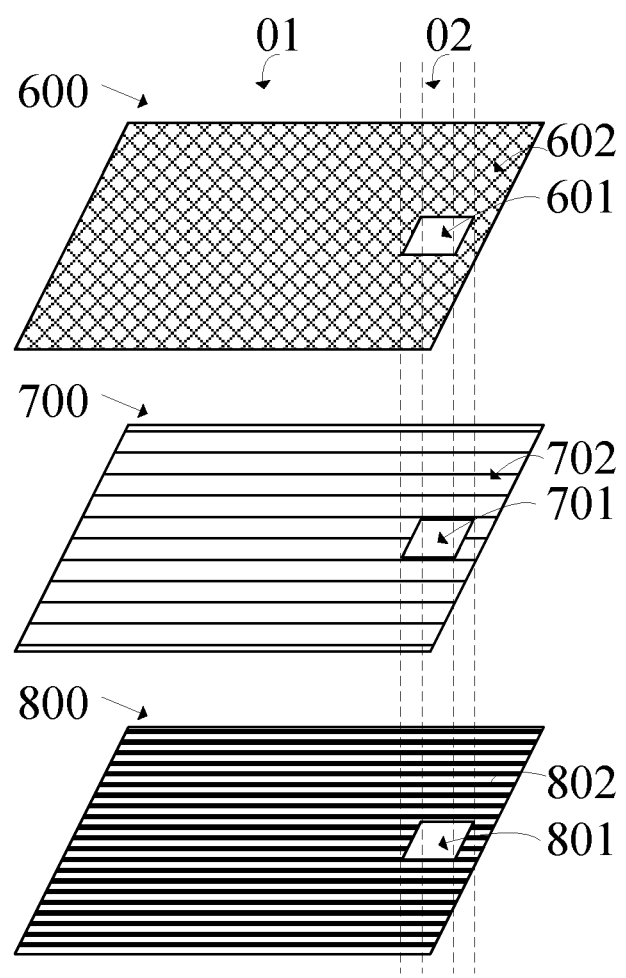
FIG. 6 is a schematic view showing a mask plate group provided by an embodiment of the present disclosure.

In one embodiment, as shown in FIG. 6, the mask plate group includes a first mask plate 600 configured to process a photoresist layer 700 in the display area 01 and the light-sensing area 02. The first mask plate 600 includes: a first opening part 601, wherein the first opening part 601 corresponds to the light-sensing area 02 and is configured to expose an area 701 on the photoresist layer 700 in the light-sensing area 02; and a shielding part 602, wherein the shielding part 602 corresponds to the display area 01, the photoresist layer 700 is disposed on a reflective film 800, and the first shielding part 602 is configured to shield an area 702 on the photoresist layer 700 in the display area 01, thereby retaining the area 702 on the photoresist layer 700 in the display area 01, and further retaining an area on the reflective film 800 in the display area 01 to form a reflective layer 802.

A size and a shape of the first opening part 601 may be determined according to a specific structure of the above-mentioned light-sensing device 300. The first opening part 601 allows light to enter the area 701 on the photoresist layer 700 in the light-sensing area 02 during an exposure process. The area 701 is removed after a sequential developing process, and an area 801 on the reflective film 800 in the light-sensing area 02 is removed after a sequential etching process. The first shielding part 602 is defined on all areas of the first mask plate 600 except for the first opening part 601, and is configured to block light from irradiating on the area 702 on the photoresist layer 700 in the display area 01, thereby preventing the area 702 from being removed in the sequential developing process. The reflective film 800 in the display area 01 is protected by the area 702 in the sequential etching process to form the reflective layer 802. As a result, light transmittance of layers above the light-sensing device 300 are increased.

It should be noted that the first mask plate 600 is configured to expose part of the photoresist layer 700. Therefore, the first mask plate 600 may be an optical mask plate. Multiple functional patterns can be precisely formed on a thin film, a plastic, or a glass by using the first mask plate 600, thereby forming a structure suitable for conducting selective exposure of a photoresist.

Figure 7:
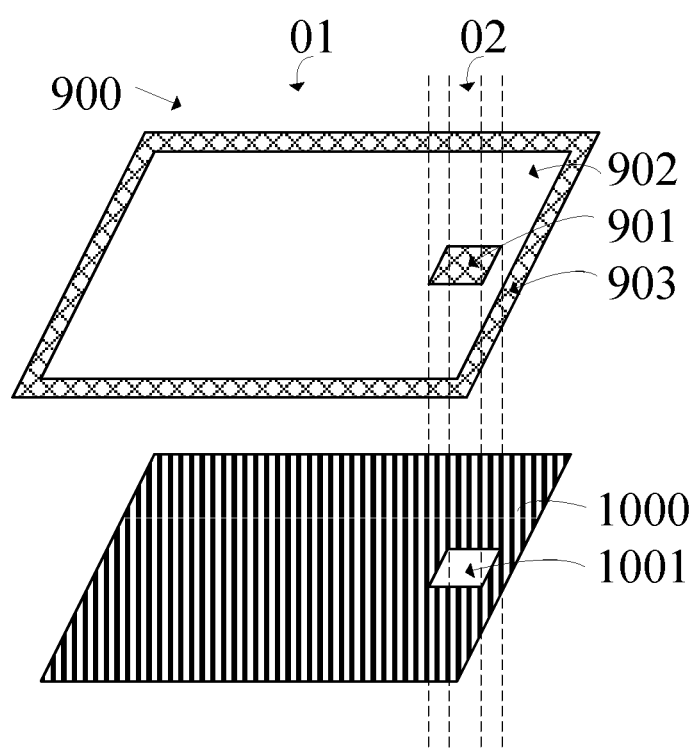
FIG. 7 is a schematic view showing another mask plate group provided by an embodiment of the present disclosure.

In one embodiment, as shown in FIG. 7, the mask plate group further includes a second mask plate 900, including: a second shielding part 901, wherein the second shielding part 901 corresponds to the light-sensing area 02 and is configured to block an evaporation material from being deposited in the light-sensing area 02 during an evaporation process; and a second opening part 902, wherein the second opening part 902 corresponds to the display area 01 and allows the evaporation material to be deposited in the display area 01 to form a cathode layer 1000.

It should be understood that a size of the display panel 00 is limited. To improve operability and save the evaporation material, the second mask plate 900 may further include an external shielding part 903. The second opening part 902 is surrounded by the external shielding part 903, and the display area 01 is defined by the external shielding part 903 and the second shielding part 901 together.

A size and a shape of the second shielding part 901 may be determined according to a specific structure of the above-mentioned light-sensing device 300. During the evaporation process, the evaporation material is deposited in the display area 01 by the second opening part 902, thereby forming the cathode layer 1000. Because the evaporation material is blocked by the second shielding part 901 from being deposited in the light-sensing area 02, the cathode layer 1000 has an opening 1001 in the light-sensing area 02. Therefore, light transmittance of layers above the light-sensing device 300 is increased.

It should be noted that the second mask plate 900 is configured to allow the evaporation material to be deposited on a predetermined area to form the cathode layer 1000. Therefore, the second mask plate 900 may be a fine metal mask plate. A main material of the second mask plate 900 may be metal or a mixture including metal and resin. During a manufacturing process of organic light-emitting diode (OLED), a luminescent device is formed by depositing a luminescent material with the second mask plate 900, and the cathode layer 1000 is formed by depositing metal or metal alloys with the second mask plate 900.

The present disclosure further provides a method of manufacturing the above-mentioned display panels.

Figure 8:
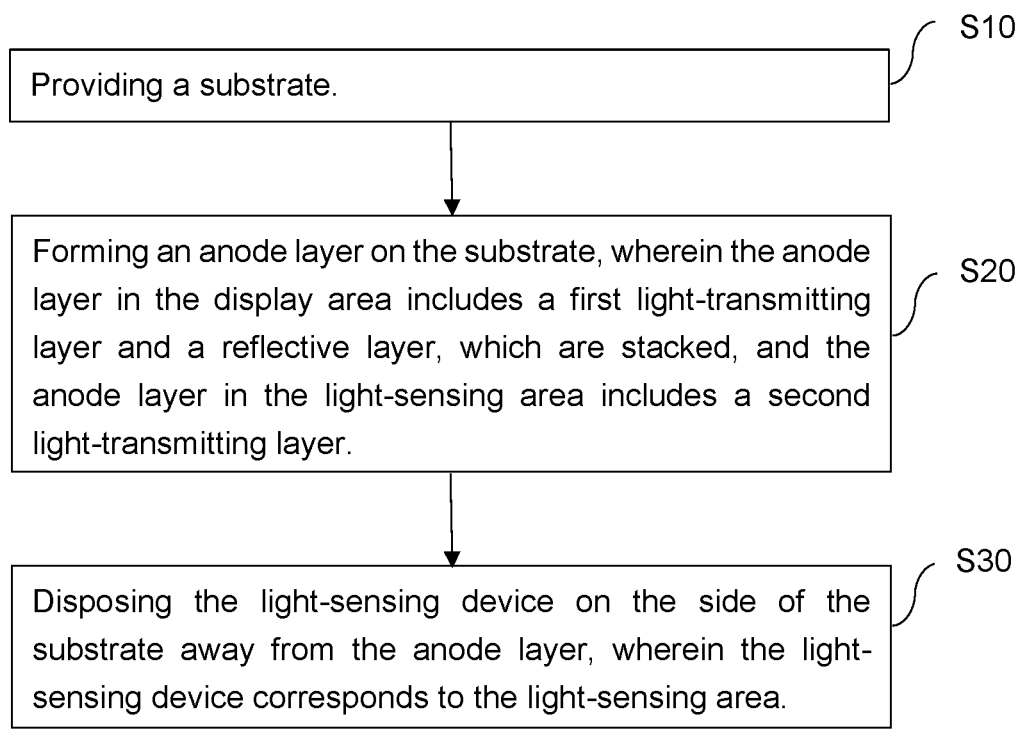
FIG. 8 is a flowchart showing a method of manufacturing a display panel according to an embodiment of the present disclosure.

In one embodiment, as shown in FIG. 8, the method includes following steps:

S10, providing a substrate.

A type of the substrate may be determined according to a type of the display panel. For example, when the display panel is a flexible OLED display panel, the substrate may be a flexible substrate such as a plastic substrate. Specifically, the substrate may be made of polyimide having good heat resistance and stability. Furthermore, the substrate may have a stacked structure including a polymer and an inorganic nanosubstance. Therefore, compared with substrates only made of a polymer, a moisture transport property of the substrate including the polymer and the inorganic nanosubstance can be significantly improved, and bendability of the substrate remains unchanged. In another example, when the display panel is a rigid OLED display panel, the substrate may be a rigid substrate such as a glass substrate.

S20, forming an anode layer on the substrate, wherein the anode layer in the display area includes a first light-transmitting layer and a reflective layer, which are stacked, and the anode layer in the light-sensing area includes a second light-transmitting layer.

The first light-transmitting layer and the second light-transmitting layer may be disposed on a same layer, thereby at least ensuring light transmittance of the second light-transmitting layer. As a result, ambient light can pass through the second light-transmitting layer and enter the light-sensing device. Furthermore, a thickness of the first light-transmitting layer and a thickness of the second light-transmitting layer may be equal, and a material of the first light-transmitting layer and a material of the second light-transmitting layer may be same. For example, the first light-transmitting layer and the second light-transmitting layer may be simultaneously formed on the substrate and are formed from a same material, thereby improving manufacturing efficiency.

It should be understood that the anode layer in the display area includes the first light-transmitting layer and the reflective layer, which are stacked, and the anode layer in the light-sensing area includes the second light-transmitting layer. Thus, a thickness of the anode layer in the display area is greater than a thickness of the anode layer in the light-sensing area, and light transmittance of the anode layer in the light-sensing area is greater than light transmittance of the anode layer in the display area.

Figure 9:
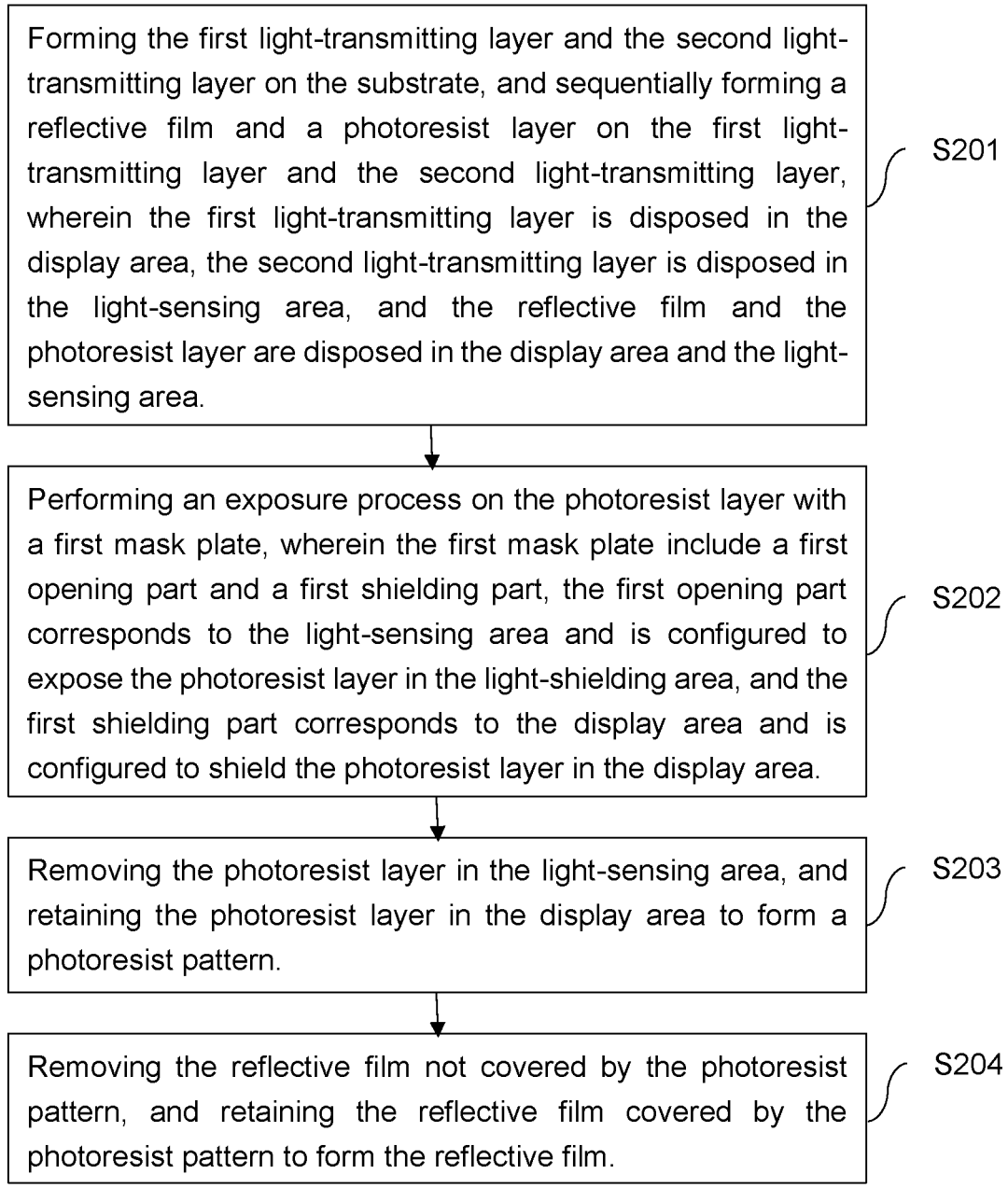
FIG. 9 is a flowchart showing a method of manufacturing another display panel according to an embodiment of the present disclosure.

In one embodiment, as shown in FIG. 9, the step 20 may include following steps:

S201, forming the first light-transmitting layer and the second light-transmitting layer on the substrate, and sequentially forming a reflective film and a photoresist layer on the first light-transmitting layer and the second light-transmitting layer, wherein the first light-transmitting layer is disposed in the display area, the second light-transmitting layer is disposed in the light-sensing area, and the reflective film and the photoresist layer are disposed in the display area and the light-sensing area.

The first light-transmitting layer and the second light-transmitting layer are simultaneously formed on the substrate, are formed from a same material, and fully cover the display area and the light-sensing area. Specifically, the first light-transmitting layer and the second light-transmitting layer may be formed by depositing a transparent conductive film on the entire substrate or other layers. The transparent conductive film may be an indium tin oxide (ITO) thin film or an Al-doped zinc oxide thin film.

A material of the reflective layer may be a conductive material having high reflectivity, thereby reflecting ambient light or light emitted from a luminescent device, and increasing luminous intensity of the display panel. For example, a material of the reflective film may be a metal element such as silver. The reflective film may be formed on the first light-transmitting layer and the second light-transmitting layer using a deposition method.

A material of the photoresist layer may be a positive photoresist or a negative photoresist. The positive photoresist is difficult to be dissolved in developer, but is easy to be dissolved in developer after dissociating into small molecules by exposure to light. The negative photoresist is difficult to be dissolved in developer after exposure to light. Specifically, the photoresist layer may be coated on the reflective film, thereby fully covering the reflective film.

S202, performing an exposure process on the photoresist layer with a first mask plate, wherein the first mask plate include a first opening part and a first shielding part, the first opening part corresponds to the light-sensing area and is configured to expose the photoresist layer in the light-shielding area, and the first shielding part corresponds to the display area and is configured to shield the photoresist layer in the display area.

The first mask plate is applied to the photoresist layer made of positive photoresist. Specifically, a size and a shape of the first opening part may be determined according to a specific structure of the above-mentioned light-sensing device. The first opening part allows light to enter the photoresist layer in the light-sensing area during an exposure process. The first shielding part is defined on all areas of the first mask plate except for the first opening part, and is configured to preventing light from entering the photoresist layer in the display area.

Since the photoresist dissociates into small molecules after exposure, a structure easy to be dissolved in developer is formed. That is, the structure easy to be dissolved in developer is formed after the area on the photoresist layer in the light-sensing area is exposed to light.

S203, removing the photoresist layer in the light-sensing area, and retaining the photoresist layer in the display area to form a photoresist pattern.

The photoresist layer may be processed with developer after exposure, and the developer can be determined according to a specific material of the photoresist layer. It should be understood that only the photoresist layer in the light-sensing area is exposed to light. Therefore, only the photoresist layer in the light-sensing area is dissolved in developer and is removed. The photoresist in the display area is retained on the reflective layer to form the photoresist pattern after a developing process.

S204, removing the reflective film not covered by the photoresist pattern, and retaining the reflective film covered by the photoresist pattern to form the reflective film.

The reflective film may be processed with developer configured to dissolve the reflective film. For example, when a material of the reflective film is silver, the developer may be a mixed acid of phosphoric acid, nitric acid, and acetic acid. It should be understood that the reflective film in the light-sensing area is not provided with the photoresist pattern and is exposed to air. Therefore, the reflective film in the light-sensing area is removed after an etching process, and the reflective film in the display area is retained to form the reflective layer. After the reflective film not provided with the photoresist pattern is removed, the retained photoresist pattern needs to be removed by being soaked with a photoresist stripper, thereby exposing the reflective layer.

Furthermore, after the reflective layer is formed, a third light-transmitting layer may further be disposed on the reflective layer and the second light-transmitting layer. Specifically, a material and a forming method of the third light-transmitting layer may be same as those of the first light-transmitting layer.

In one embodiment, before the step 20, the method may include following steps:

S50, forming a thin-film transistor (TFT) layer on the substrate, wherein the TFT layer includes a plurality of TFTs disposed in the display area.

Specifically, the TFTs are electrically connected to corresponding areas on the anode layer, thereby controlling luminance of the corresponding areas on the anode layer. It should be understood that the TFTs include devices having low light transmittance, and the TFTs at a same row or at a same column are connected to each other by a same gate line or a same data line, thereby transmitting signals. In this case, the TFTs are not disposed in the light-sensing area. That is, the TFT layer in the light-sensing area is not provided with the TFTs having extremely low light transmittance, the gate lines, and the data lines. In the present disclosure, because the TFTs are not disposed in the TFT layer in the light-sensing area, a number of metal lines, such as the data lines and the data lines, in the light-sensing area can be reduced. Therefore, light transmittance of the light-sensing area is increased.

In one embodiment, after the step 20, the method may include following steps.

S60, forming a cathode layer on the anode layer in the display area.

A material of the cathode layer may be a magnesium silver alloy or a lithium aluminum alloy. Specifically, the cathode layer can be formed by evaporating low work function metal with lively chemical property and high work function work metal with stable chemical property, thereby improving quantum efficiency and stability of the device. Alternatively, the cathode layer may be two electrodes formed from a single metal layer made of a metal element and a barrier layer, which is disposed between the single metal layer and a corresponding luminescent device, made of lithium fluoride, cesium fluoride, or rubidium fluoride, between the signal metal layer and corresponding luminescent devices. Alternatively, the cathode layer may include the single metal layer and an organic layer, which is doped with low work function metal, between the single metal layer and the corresponding luminescent devices, thereby significantly improving performance of the luminescent device.

Specifically, an evaporation material may be deposited on the anode layer with a second mask plate, wherein the second mask plate includes a second shielding part and a second opening part, the second shielding part corresponds to the light-shielding area and is configured to block the evaporation material from being deposited in the light-sensing area during an evaporation process, and the second opening part corresponds to the display area and is configured to allow the evaporation material to be deposited in the display area to form the cathode layer.

It should be noted that the second mask plate is configured to allow the evaporation material to be deposited on a predetermined area to form the cathode layer. Therefore, the second mask plate may be a fine metal mask plate. A main material of the second mask plate may be metal or a mixture including metal and resin. During a manufacturing process of organic light-emitting diode (OLED), a luminescent device is formed by depositing a luminescent material with the second mask plate, and the cathode layer is formed by depositing metal or metal alloys with the second mask plate.

S30, disposing the light-sensing device on the side of the substrate away from the anode layer, wherein the light-sensing device corresponds to the light-sensing area.

The light-sensing device 300 may work individually, or may be embedded in a camera lens or a fingerprint recognition device.

It should be understood that the reflective layer of the anode layer is disposed only in the display area. That is, the reflective layer, which has relatively high reflectivity, is not disposed in the light-sensing area. Furthermore, because the light-sensing device corresponds to the light-sensing area, an amount of light entering the light-sensing device is increased, and working efficiency of the light-sensing device is improved.

In one embodiment, before the step 30, the method may include following steps:

S40, preprocessing the substrate to form a first substrate and a second substrate, wherein a thickness of the first substrate is less than a thickness of the second substrate, the first substrate corresponds to the light-sensing area, and the second substrate corresponds to the display area.

Specifically, when the substrate is a flexible substrate, the flexible substrate may be formed on a rigid base, thereby stabling the flexible substrate. After relevant layers on the flexible substrate are formed, the rigid base is removed. Then, the step S40 is performed. As a result, layers above the substrate will not be uneven caused by inconsistent thickness of the substrate.

The first substrate may have an even thickness. Alternatively, a surface of a side of the first substrate near the light-sensing device 300 may be a curved surface. The thickness of the first substrate may be determined according to a height the light-sensing device, and a shape of the surface of the side of the first substrate 101 near the light-sensing device may be determined according to a shape of the light-sensing device. Furthermore, because the second substrate does not correspond to the light-sensing device, a thickness of the second substrate may be equal to a thickness of the substrate before the step S40 is performed. The first substrate may be formed by only processing an area on the substrate corresponding to the light-sensing device.

Specifically, the first substrate can be formed by etching an area on the substrate near and corresponding to the light-sensing device (refer to a forming method of the reflective layer). Specifically, an etchant may be a mixed solution of potassium hydroxide and potassium carbonate, hydrazine hydrate, or hexafluoroisopropanol. Alternatively, the first substrate may be formed by physically rubbing a predetermined area on the substrate. Alternatively, the first substrate may be formed by radiating ions on a predetermined area on the substrate. Specifically, the predetermined area may be irradiated with heavy ions including oxygen. When intensity of irradiation increases to a certain range, some materials in the predetermined area will be oxidized and degradated. Then, imide rings and benzene rings will be destroyed to form peroxide and carboxylic acid. Therefore, some materials in the predetermined area will be brittle, so that strength of the materials decreases. Finally, the materials will be destroyed, thereby thinning the predetermined area.

The present disclosure provides a display panel, a manufacturing method thereof, and a mask plate group. The display panel includes a display area and a light-sensing area, an anode layer in display area includes a first light-transmitting layer and a reflective layer, which are stacked, the anode layer in the light-sensing area includes a second light-transmitting layer, and a light-sensing device is disposed on a side of a substrate away from the anode layer in the light-sensing. In the present disclosure, only the light transmitting layer is disposed in the anode layer in the light-sensing device, and a reflective layer is omitted. Therefore, light transmittance of the layers above the light-sensing device is increased, and working performance of the light-sensing device of the display panel is improved.

A display panel, a manufacturing thereof, and a mask plate group have been described in detail with embodiments provided by the present disclosure which illustrates principles and implementations thereof. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising a display area and a light-sensing area,
wherein the display area comprises:
a substrate;
an anode layer disposed on a side of the substrate, wherein the anode layer in the display area comprises a first light-transmitting layer and a reflective layer, which are stacked, and the anode layer in the light-sensing area comprises a second light-transmitting layer; and
a light-sensing device disposed on a side of the substrate away from the anode layer in the light-sensing area; and
wherein the display panel further comprises:
a thin-film transistor (TFT) layer disposed on a side of the substrate near the anode layer, wherein the TFT layer comprises a plurality of TFTs disposed only in the display area, and the plurality of TFTs are not disposed in the light-sensing area.

2. The display panel of claim 1, wherein the substrate comprises:
a first substrate disposed in the light-sensing area; and
a second substrate disposed in the display area, wherein a thickness of the first substrate is less than a thickness of the second substrate.

3. The display panel of claim 1, wherein the display panel further comprises:
a cathode layer disposed on a side of the anode layer away from the substrate in the display area.

4. The display panel of claim 1, wherein when the first light-transmitting layer and the second light-transmitting layer are disposed on a same layer, and the anode layer further comprises:
a third light-transmitting layer disposed on the second light-transmitting layer and on a side of the reflective layer away from the light-sensing device.

5. A mask plate group configured to manufacture the display panel of claim 1, wherein the display panel comprises the display area and the light-sensing area, the mask plate group comprises a first mask plate configured to process a photoresist layer in the display area and the light-sensing area, and the first mask plate comprises:
a first opening part, wherein the first opening part corresponds to the light-sensing area and is configured to expose the photoresist layer in the light-sensing area; and
a first shielding part, wherein the first shielding part corresponds to the display area, the photoresist layer is disposed on a reflective film, and the first shielding part is configured to shield the photoresist layer in the display area, thereby retaining the photoresist layer in the display area, and further retaining the reflective film in the display area to form the reflective layer.

6. The mask plate group of claim 5, wherein the mask plate group further comprises a second mask plate, and the second mask plate comprises:
a second shielding part, wherein the second shielding part corresponds to the light-sensing area and is configured to block an evaporation material from being deposited on the light-sensing area during an evaporation process; and
a second opening part, wherein the second opening part corresponds to the display area and is configured to allow the evaporation material to be deposited in the display area to form a cathode layer.

7. A method of manufacturing the display panel of claim 1, wherein the display panel comprises the display area and the light-sensing area, and the method comprises following steps:
providing the substrate;
forming the anode layer on the substrate, wherein the anode layer in the display area comprises the first light-transmitting layer and the reflective layer, which are stacked, and the anode layer in the light-sensing area comprises the second light-transmitting layer; and
disposing the light-sensing device on the side of the substrate away from the anode layer, wherein the light-sensing device corresponds to the light-sensing area.

8. The method of claim 7, wherein in the step of forming the anode layer on the substrate, wherein the anode layer in the display area comprises the first light-transmitting layer and the reflective layer, which are stacked, and the anode layer in the light-sensing area comprises the second light-transmitting layer, the method comprises following steps:
forming the first light-transmitting layer and the second light-transmitting layer on the substrate, and sequentially forming a reflective film and a photoresist layer on the first light-transmitting layer and the second light-transmitting layer, wherein the first light-transmitting area is disposed in the display area, the second light-transmitting layer is disposed in the light-sensing area, and the reflective film and the photoresist layer are disposed in the display area and the light-sensing area;

performing an exposure process on the photoresist layer with a first mask plate, wherein the first mask plate comprises a first opening part and a first shielding part, the first opening part corresponds to the light-sensing area and is configured to expose the photoresist layer in the light-shielding area, and the first shielding part corresponds to the display area and is configured to shield the photoresist layer in the display area;

removing the photoresist layer in the light-sensing area, and retaining the photoresist layer in the display area to form a photoresist pattern; and removing the reflective film not covered by the photoresist pattern, and retaining the reflective film covered by the photoresist pattern to form the reflective layer.

9. The method of claim 8, wherein after the step of removing the reflective film not covered by the photoresist pattern, and retaining the reflective film covered by the photoresist pattern to form the reflective layer, the method further comprises a following step:

forming a third light-transmitting layer on the reflective layer and the second light-shielding layer.

10. The method of claim 7, wherein before the step of forming the light-sensing device on the side of the substrate away from the anode layer, the method comprises:

processing the substrate to form a first substrate and a second substrate, wherein a thickness of the first substrate is less than a thickness of the second substrate, the first substrate corresponds to the light-sensing area, and the second substrate corresponds to the display area.

11. The method of claim 7, wherein before the step of forming the anode layer on the substrate, wherein the anode layer in the display area comprises the first light-transmitting layer and the reflective layer, which are stacked, and the anode layer in the light-sensing area comprises the second light-transmitting layer, the method comprises:

forming a thin-film transistor (TFT) layer on the substrate, wherein the TFT layer comprises a plurality of TFTs disposed in the display area.

12. The method of claim 7, wherein after the step of forming the anode layer on the substrate, wherein the anode layer in the display area comprises the first light-transmitting layer and the reflective layer, which are stacked, and the anode layer in the light-sensing area comprises the second light-transmitting layer, the method comprises a following step:

forming a cathode layer on the anode layer in the display area.

13. The method of claim 12, wherein in the step of forming the cathode layer on the anode layer in the display area, the method comprises a following step:

depositing an evaporation material on the anode layer with a second mask plate, wherein the second mask plate comprises a second shielding part and a second opening part, the second shielding part corresponds to the light-shielding area and is configured to block the evaporation material from being deposited in the light-sensing area during an evaporation process, and the second opening part corresponds to the display area and is configured to allow the evaporation material to be deposited in the display area to form the cathode layer.

* * * * *